United States Patent
Cao et al.

(10) Patent No.: US 10,636,820 B2
(45) Date of Patent: Apr. 28, 2020

(54) LIGHT SENSOR, LIGHT DETECTION METHOD AND DISPLAY DEVICE

(71) Applicant: BOE Technology Group Co., Ltd., Beijing (CN)

(72) Inventors: Xueyou Cao, Beijing (CN); Haisheng Wang, Beijing (CN); Xiaoliang Ding, Beijing (CN); Chih-Jen Cheng, Beijing (CN); Yanling Han, Beijing (CN); Wei Liu, Beijing (CN); Pengpeng Wang, Beijing (CN); Ping Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 142 days.

(21) Appl. No.: 16/002,193

(22) Filed: Jun. 7, 2018

(65) Prior Publication Data
US 2019/0206913 A1  Jul. 4, 2019

(30) Foreign Application Priority Data

Jan. 2, 2018 (CN) .......................... 2018 1 0003164

(51) Int. Cl.
*H01L 31/10* (2006.01)
*H01L 27/146* (2006.01)
*G01J 1/42* (2006.01)

(52) U.S. Cl.
CPC .......... *H01L 27/14612* (2013.01); *G01J 1/42* (2013.01); *H01L 27/14623* (2013.01); *H01L 31/10* (2013.01)

(58) Field of Classification Search
CPC .......................... H01L 31/10; G09G 2360/148
See application file for complete search history.

(56) References Cited

U.S. PATENT DOCUMENTS 7,663,080 B2 * 2/2010 Tsai ...................... H01L 31/153
250/205

FOREIGN PATENT DOCUMENTS

CN           101281916 B        5/2010

* cited by examiner

*Primary Examiner* — Thanh Luu
(74) *Attorney, Agent, or Firm* — McDermott Will & Emery LLP

(57) ABSTRACT

Embodiments of the present disclosure provides a light sensor, including: a first thin film transistor, having a first terminal connected to a first node, a second terminal receiving a first level signal, and a control terminal receiving a first control signal; a second thin film transistor, having a first terminal connected to the first node, a second terminal receiving a second level signal, and a control terminal receiving a second control signal; a voltage follower, having an input terminal connected to the first node, and an output terminal; the third thin film transistor, having a first terminal connected to the output terminal of the voltage follower, a second terminal connected to an input terminal of an output unit, and a control terminal receiving a third control signal; and the output unit, having an input terminal connected to the second terminal of the third thin film transistor, and an output terminal connected to an output terminal of the light sensor.

19 Claims, 5 Drawing Sheets

LIGHT SENSOR, LIGHT DETECTION METHOD AND DISPLAY DEVICE

CROSS-REFERENCE TO RELATED APPLICATION(S)

This application claims priority to Chinese Application No. 201810003164.8, entitled "LIGHT SENSOR, LIGHT DETECTION METHOD AND DISPLAY DEVICE" and filed on Jan. 2, 2018, which is incorporated herein by reference in its entirety.

TECHNICAL FIELD

The present disclosure relates to the field of light detection technology, and in particular, relates to a light sensor, a light detection method, and a display device.

BACKGROUND

Currently, there are many kinds of sensors for detecting light, among which light-sensitive sensors are more prominent ones. However, there are fewer kinds of light sensors that may be integrated on glass substrates. Light sensitive characteristics of thin film transistors made of different materials are different. For example, amorphous silicon (A-Si) has the best light sensitive characteristic, and a low-temperature polysilicon and back channel etch (BCE) thin film transistor has a better inert characteristic to light.

SUMMARY

A first aspect of the present disclosure provides a light sensor. The light sensor includes: a first thin film transistor, a second thin film transistor, a voltage follower, a third thin film transistor and an output unit, wherein the first thin film transistor has a first terminal connected to a first node, a second terminal receiving a first level signal, and a control terminal receiving a first control signal; the second thin film transistor has a first terminal connected to the first node, a second terminal receiving a second level signal, and a control terminal receiving a second control signal; the voltage follower has an input terminal connected to the first node, and an output terminal connected to a first terminal of the third thin film transistor; the third thin film transistor has a first terminal connected to the output terminal of the voltage follower, a second terminal connected to an input terminal of the output unit, and a control terminal receiving a third control signal; and the output unit has an input terminal connected to the second terminal of the third thin film transistor, and an output terminal connected to an output terminal of the light sensor, wherein when one of the first thin film transistor and the second thin film transistor is turned on in response to the control signal of the one thin film transistor, the third thin film transistor is turned on in response to the third control signal, a voltage of the first node is transmitted to the input terminal of the output unit via the voltage follower, and the output unit outputs a first digital voltage at its output terminal; and wherein when the one thin film transistor is turned off, the other one of the first thin film transistor and the second thin film transistor receives light irradiation to generate a light leakage current, the voltage of the first node is transmitted to the input terminal of the output unit via the voltage follower, and the output unit outputs a second digital voltage at its output terminal.

Further, active region material of the other one of the first thin film transistor and the second thin film transistor is amorphous silicon; and the one of the first thin film transistor and the second thin film transistor, the voltage follower and/or the third thin film transistor are BCE type thin film transistors or low temperature polysilicon thin film transistors.

Further, a light shielding module is arranged on the one of the first thin film transistor and the second thin film transistor, the voltage follower and/or the third thin film transistor for blocking light irradiation thereon.

Further, the light shielding module is a black matrix.

Further, the output unit includes a current source connected between the second terminal of the third thin film transistor and ground and an A/D converter connected between the second terminal of the third thin film transistor and the output terminal of the output unit.

A second aspect of the present disclosure provides a light detection method using the light sensor according to the first aspect. The light detection method includes steps of: S101: turning on the one of the first thin film transistor and the second thin film transistor in response to the control signal of the one thin film transistor; S103: turning on the third thin film transistor in response to the third control signal, wherein the voltage of the first node is transmitted to the input terminal of the output unit via the voltage follower, and the output unit outputs the first digital voltage, and then turning off the one thin film transistor, and turning off the third thin film transistor; S105: irradiating light on the other one of the first thin film transistor and the second thin film transistor to generate the light leakage current; S107: after the light has been irradiated for a predetermined time, turning on the third thin film transistor in response to the third control signal, wherein the voltage of the first node is transmitted to the output unit via the voltage follower, and the output unit outputs the second digital voltage, and then turning off the third thin film transistor; and S109: calculating a light intensity value of the light irradiated according to the first digital voltage and the second digital voltage.

Further, the light detection method includes steps of: S201: taking the second thin film transistor as the one thin film transistor in step S101, and the first thin film transistor as the other thin film transistor in step S105, and performing steps S101-S109; S203: taking the first thin film transistor as the one thin film transistor in step S101, and the second thin film transistor as the other thin film transistor in step S105, and performing steps S101-S109; and S205: performing a weighted average of the light intensity value calculated in step S201 and the light intensity value calculated in step S203 to calculate a final light intensity value.

A third aspect of the present disclosure provides a display panel, including the light sensor according to the first aspect.

A fourth aspect of the present disclosure provides a display device, including the display panel according to the third aspect.

It is understood that other embodiments and configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

Detailed description of the present disclosure will be described in detail below with reference to the accompanying drawings. The following descriptions are intended to be illustrative and should not be considered to limit the scope of the disclosure.

DETAILED DESCRIPTION

Figure 1:
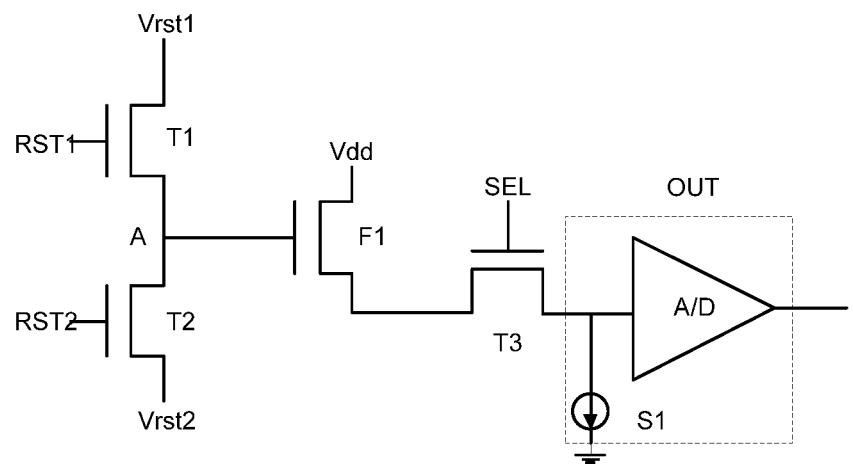
FIG. 1 shows a schematic diagram of a light sensor according to an embodiment of the present disclosure.

In order to illustrate the present disclosure more clearly, the present disclosure will be further described below in conjunction with the following drawings and a preferred embodiment. Similar parts in the drawings are denoted with the same reference numbers. It should be understood by the skilled in the art that the following detailed description is illustrative but not restrictive, and should not limit the scope of the present disclosure.

A light sensor according to the present embodiment includes: a first thin film transistor, a second thin film transistor, a voltage follower, a third thin film transistor and an output unit, wherein the first thin film transistor has a first terminal connected to a first node, a second terminal receiving a first level signal, and a control terminal receiving a first control signal; the second thin film transistor has a first terminal connected to the first node, a second terminal receiving a second level signal, and a control terminal receiving a second control signal; the voltage follower has an input terminal connected to the first node, and an output terminal connected to a first terminal of the third thin film transistor; the third thin film transistor has a first terminal connected to the output terminal of the voltage follower, a second terminal connected to an input terminal of the output unit, and a control terminal receiving a third control signal; and the output unit has an input terminal connected to the second terminal of the third thin film transistor, and an output terminal connected to an output terminal of the light sensor. When one of the first thin film transistor and the second thin film transistor is turned on in response to the control signal of the one thin film transistor, the third thin film transistor is turned on in response to the third control signal, a voltage of the first node is transmitted to the input terminal of the output unit via the voltage follower, and the output unit outputs a first digital voltage at its output terminal. When the one thin film transistor is turned off, the other one of the first thin film transistor and the second thin film transistor receives light irradiation to generate a light leakage current, the voltage of the first node is transmitted to the input terminal of the output unit via the voltage follower, and the output unit outputs a second digital voltage at its output terminal.

One of the first thin film transistor and the second thin film transistor of the light sensor according to the present embodiment is reset in response to the control signal, and the other receives the light irradiation. Each of the first and the second thin film transistors may be turned on in response to the control signal thereof, to input the signal received at the second terminal into the first node by reset. That is, the first thin film transistor is turned on in response to the first control signal, and inputs the first level into the first node as a reference potential; and the second thin film transistor is turned on in response to the second control signal, and inputs the second level into the first node as the reference potential. After the first and second thin film transistors receive the light irradiation, they may generate the light leakage currents, which may cause change of the potential of the first node.

In practical applications, if the first thin film transistor is selected to perform the reset operation, the second thin film transistor is selected to receive the light irradiation to generate the light leakage current, and if the second thin film transistor is selected to perform the reset operation, the first thin film transistor is selected to receive the light irradiation to generate the light leakage current, so as to cause the change of the potential of the first node.

The voltage follower is used to follow the voltage of the first node and output a following voltage, that is, the voltage of the first node is output to the first terminal of the third thin film transistor via the voltage follower.

The third thin film transistor is turned on in response to the third control signal, and transmits the following voltage output from the voltage follower to the output unit. In practical applications, when one of the first and the second thin film transistors resets in response to the control signal thereof and inputs a reset level to the first node, the third control signal is switched from a low level to a high level, the third thin film transistor is turned on and obtains the voltage of the first node via the voltage follower, and the voltage of the first node is transmitted as the first voltage to the output unit. Then the third control signal is switched from the high level to the low level, and the third thin film transistor is turned off. After the one thin film transistor that is selected to perform the reset operation is turned off, the other one of the first and the second thin film transistors starts to receive the light irradiation to generate the light leakage current. After the light is irradiated for a predetermined time, the third control signal changes from the low level to the high level, the third thin film transistor is turned on and obtains the voltage of the first node through the voltage follower, and the voltage of the first node is transmitted as the second voltage to the output unit. Then the third control signal is switched from the high level to the low level, and the third thin film transistor is turned off.

The output unit receives the first voltage and the second voltage output by the third thin film transistor, and outputs a first digital voltage and a second digital voltage stably by internal voltage regulation and A/D conversion of the output unit.

Figure 2:
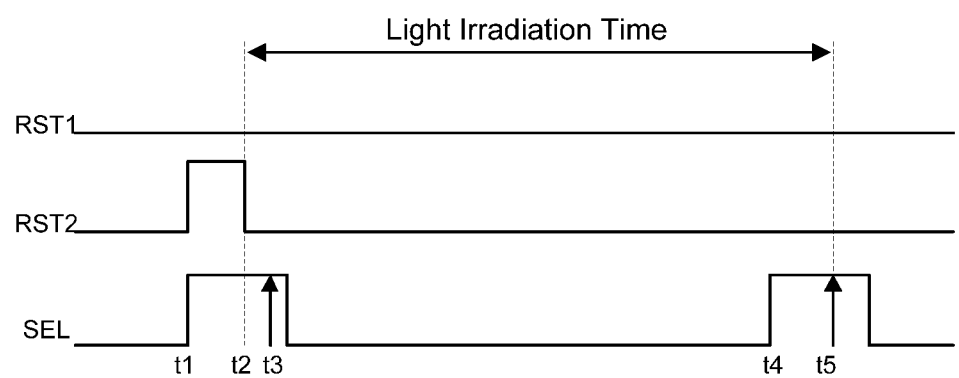
FIG. 2 shows a control timing sequence of the light sensor of FIG. 1.

In a specific example, as shown in FIGS. 1 and 2, the first terminal of the first thin film transistor T1, the first terminal of the second thin film transistor T2, and the input terminal of the voltage follower F1 are connected to the first node A.

The control terminal of the first thin film transistor T1 receives the first control signal RST1, and the second terminal thereof receives a signal of the first level Vrst1. The first thin film transistor T1 is turned on in response to the first control signal RST1, and the potential of the first node A is pulled to the first level Vrst1 as the reference voltage.

The control terminal of the second thin film transistor T2 receives the second control signal RST2, and the second terminal thereof receives a signal of the second level Vrst2. The second thin film transistor T2 is turned on in response to the second control signal RST2, and the potential of the first node A is pulled to the second level Vrst2 as the reference voltage.

A collector of the voltage follower receives a power signal Vdd, and the output terminal outputs the voltage of the first node A to the first terminal of the third thin film transistor T3.

The control terminal of the third thin film transistor T3 receives the third control signal SEL, and the second terminal thereof is connected to the input terminal of the output unit OUT. The third thin film transistor T3 is turned on in response to the third control signal SEL, and transmits the voltage of the first node A as the second voltage to the output unit via the voltage follower.

The output unit OUT includes: a current source S1 connected between the second terminal of the third thin film transistor and ground, and an A/D converter connected between the second terminal of the third thin film transistor and the output terminal of the output unit. The obtained voltage is clamped by the current source S1 in a stable operation state, and the A/D converter is used to convert the obtained analog voltage into a digital voltage and output the digital voltage.

As shown in FIG. 2, at time t1, each of the second control signal RST2 and the third control signal SEL is switched from the low level to the high level, so that the second thin film transistor T2 and the third thin film transistor T3 are turned on, the first thin film transistor T1 is turned off, the voltage follower operates in an amplification region, and the potential of the first node A is at the second level Vrst2.

At time t2, the second control signal RST2 is switched from the high level to the low level, so that the second thin film transistor T2 is turned off, and the potential of the first node A is clamped at Vrst2. The first thin film transistor T1 operates in the off state and starts to receive the light irradiation.

At time t3, the third thin film transistor T3 is in the on state, the voltage follower operates in the amplification region, the third thin film transistor T3 obtains the voltage of the first node A through the voltage follower as a reference voltage value for measuring the light intensity. Then the third control signal SEL is switched from the high level to the low level, and the third thin film transistor T3 transmits the obtained voltage to the output unit. The obtained voltage is clamped by the current source of the output unit in the stable operation state and is converted by the A/D converter into the first digital voltage signal, then the first digital voltage signal is output, and the third thin film transistor T3 is turned off.

From time t2 to time t5, the first thin film transistor T1 receives the light irradiation, the source and the drain of the first thin film transistor T1 generate the light leakage current, and the potential of the first node A changes.

After the first thin film transistor T1 has been receiving the light irradiation for the predetermined time, the third control signal SEL is switched from the low level to the high level at time t4, thus the third thin film transistor T3 is turned on, and is ready to obtain the voltage of the first node A.

At time t5, the third thin film transistor T3 is in the on state, the voltage follower F1 operates in the amplification region, and the third thin film transistor T3 obtains the voltage of the first node A through the voltage follower, i.e., the potential of the first node A which changes after the first thin film transistor T1 receives the light irradiation. This voltage is used as a light-sensitive voltage value of the measured light intensity. The third thin film transistor T3 transmits the obtained voltage to the output unit, the obtained voltage is clamped by the current source of the output unit in the stable operation state and is converted into the second digital voltage signal by the A/D converter, and the second digital voltage signal is then output. Next, the third control signal SEL is switched from the high level to the low level, and the third thin film transistor T3 is turned off.

As such, the light sensor of the present embodiment has completed the process of light detection, in which the reference voltage value is obtained by resetting the second thin film transistor T2, and the light-sensitive voltage value is obtained by irradiating light on the first thin film transistor T1, and the two obtained voltages are converted into digital voltages for calculating the light intensity value of the light irradiation based on a voltage difference between the two digital voltages.

In the present embodiment, the first thin film transistor T1 is a light sensing thin film transistor. Further, active region material of the first thin film transistor T1 is A-S1, and the second thin film transistor, the voltage follower, and/or the third thin film transistor are BCE type thin film transistors or low temperature polysilicon thin film transistors. Since the light sensitive characteristics of the thin film transistors made of different materials are different, for example, A-Si has the best light sensitive characteristic, and thus may be used as a light-sensitive thin film transistor; for another example, the low-temperature polysilicon and BCE thin film transistor has a better inert characteristic to light, and thus may be used as a non-light-sensitive thin film transistor.

Further in the present embodiment, each of the second thin film transistor, the voltage follower and/or the third thin film transistor is provided with a shading module for blocking the light irradiation thereon, so that the thin film transistor for providing the reference voltage by reset, the voltage follower, and/or the third thin film transistor may operate stably without being affected by the light irradiation, so as to improve accuracy of light detection.

Further, the light shielding module is a black matrix.

The light sensor of the present embodiment obtains the reference voltage value by resetting one thin film transistor, and obtains the light-sensitive voltage value by irradiating light on the other thin film transistor, and uses the voltage difference between the two detected voltages to calculate the light intensity value. The light detection is achieved by using the thin film transistors only, and the detection test accuracy is also improved.

Figure 3:
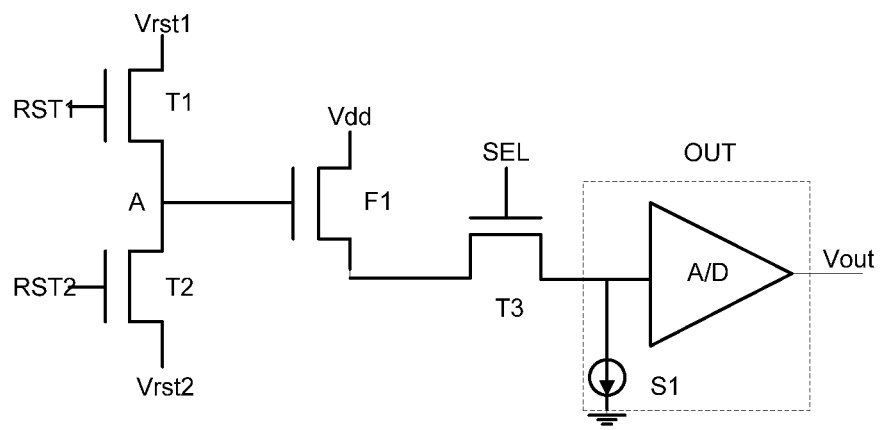
FIG. 3 shows a schematic diagram of a light sensor according to another embodiment of the present disclosure.
Figure 4:
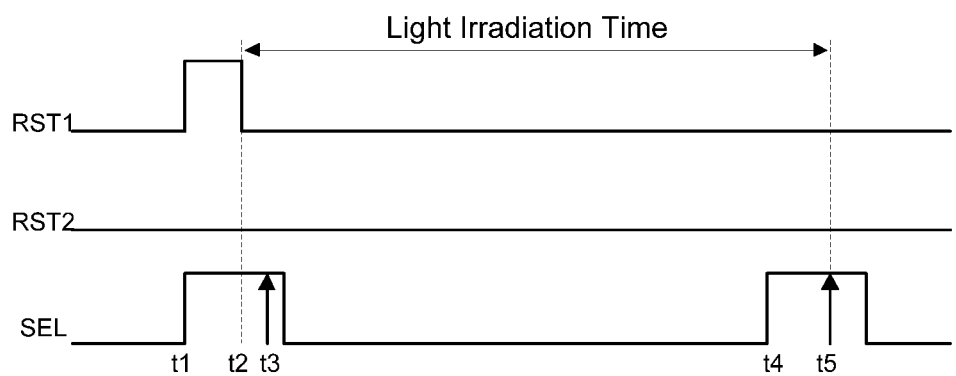
FIG. 4 shows a control timing sequence of the light sensor of FIG. 3.

In another preferred embodiment, as shown in FIGS. 3 and 4, a light shielding film is arranged on the first thin film transistor T1 to obtain the reference voltage value by reset, and the second thin film transistor T2 is used to generate a light irradiation current to obtain a light-sensitive voltage value; the third thin film transistor T3 obtains the voltage of the first node A through the voltage follower F1, and transmits the voltage to the output unit OUT to output the digital voltage.

As shown in FIG. 3, the second thin film transistor T2 is selected to receive the light irradiation. In order to ensure that other thin film transistors are not affected by the light irradiation, a shading module is arranged on the first thin film transistor T1, the voltage follower and the third thin film transistor T3 for blocking the light irradiation.

As shown in FIG. 4, at the time t1, each of the first control signal RST1 and the third control signal SEL is switched from the low level to the high level, so that the first thin film transistor T1 and the third thin film transistor T3 are turned on, the second thin film transistor T2 is turned off, the voltage follower operates in the amplification region, and the potential of the first node A is at the first level Vrst1.

At time t2, the first control signal RST1 is switched from the high level to the low level, so that the first control signal RST1 is turned off, and the potential of the first node A is clamped at Vrst1. The second thin film transistor T2 operates in the off state and begins to receive the light irradiation.

At time t3, the third thin film transistor T3 is in the on state, the voltage follower F1 operates in the amplification region, the third thin film transistor T3 obtains the voltage of the first node A through the voltage follower as a reference voltage value for measuring the light intensity. Then the third control signal SEL is switched from the high level to the low level, and the third thin film transistor T3 transmits the obtained voltage to the output unit. The obtained voltage is clamped by the current source S1 of the output unit in the stable operation state and is converted by the A/D converter into the first digital voltage signal, then the first digital voltage signal is output, and the third thin film transistor T3 is turned off.

From time t2 to time t5, the second thin film transistor T2 receives the light irradiation, the source and the drain of the second thin film transistor T2 generate the light leakage current, and the potential of the first node A changes.

After the second thin film transistor T2 has been receiving the light irradiation for the predetermined time, the third control signal SEL is switched from the low level to the high level at time t4, thus the third thin film transistor T3 is turned on, and is ready to obtain the voltage of the first node A.

At time t5, the third thin film transistor T3 is in the on state, the voltage follower F1 operates in the amplification region, and the third thin film transistor T3 obtains the voltage of the first node A through the voltage follower, i.e., the potential of the first node A which changes after the second thin film transistor T2 receives the light irradiation. This voltage is used as a light-sensitive voltage value of the measured light intensity. The third thin film transistor T3 transmits the obtained voltage to the output unit, the obtained voltage is clamped by the current source of the output unit in the stable operation state and is converted into the second digital voltage signal by the A/D converter, and the second digital voltage signal is then output. Next, the third control signal SEL is switched from the high level to the low level, and the third thin film transistor T3 is turned off.

As such, the light sensor of the present embodiment has completed the process of light detection, in which the reference voltage value is obtained by resetting the first thin film transistor T1, and the light-sensitive voltage value is obtained by irradiating light on the second thin film transistor T2, and the two obtained voltages are converted into digital voltages for calculating the light intensity value of the light irradiation based on a voltage difference between the two digital voltages.

Figure 5:
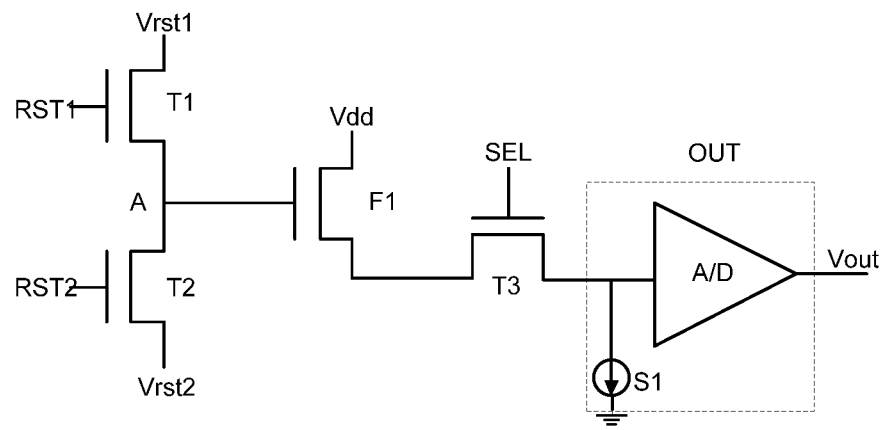
FIG. 5 shows a schematic diagram of a light sensor according to another embodiment of the present disclosure.
Figure 6:
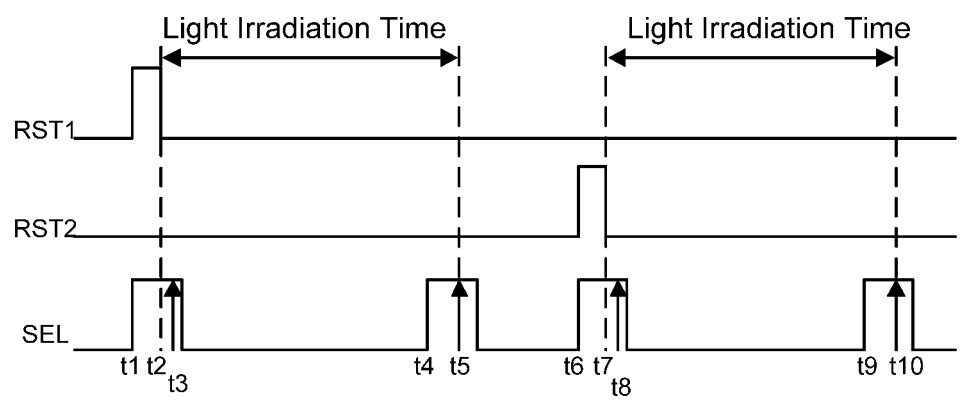
FIG. 6 shows a control timing sequence of the light sensor of FIG. 5.

In another preferred embodiment, as shown in FIGS. 5 and 6, the second thin film transistor T2 is selected for reset and the first thin film transistor T1 is selected to receive light irradiation to obtain a light intensity value; and then the first thin film transistor T1 is selected for reset and the second thin film transistor T2 is selected to receive light irradiation to obtain another light intensity value. The specific process is superposition of the processes described in the previous two embodiments, thus description thereof will not be described here for simplicity.

Assuming that the off-state voltages of RST1 and RST2 are the same, the differences between the source and the drain of the first thin film transistor T1 and between the source and the drain of the second thin film transistor T2 are the same, and the lengths of duration of the two light irradiations are the same, the light leakage currents of the first thin film transistor T1 and the second thin film transistor T2 are the same. Hence, a weighted average of the light intensity values calculated in the two processes may obtain a light intensity value with higher accuracy, improving the measurement accuracy of the light intensity.

Figure 7:
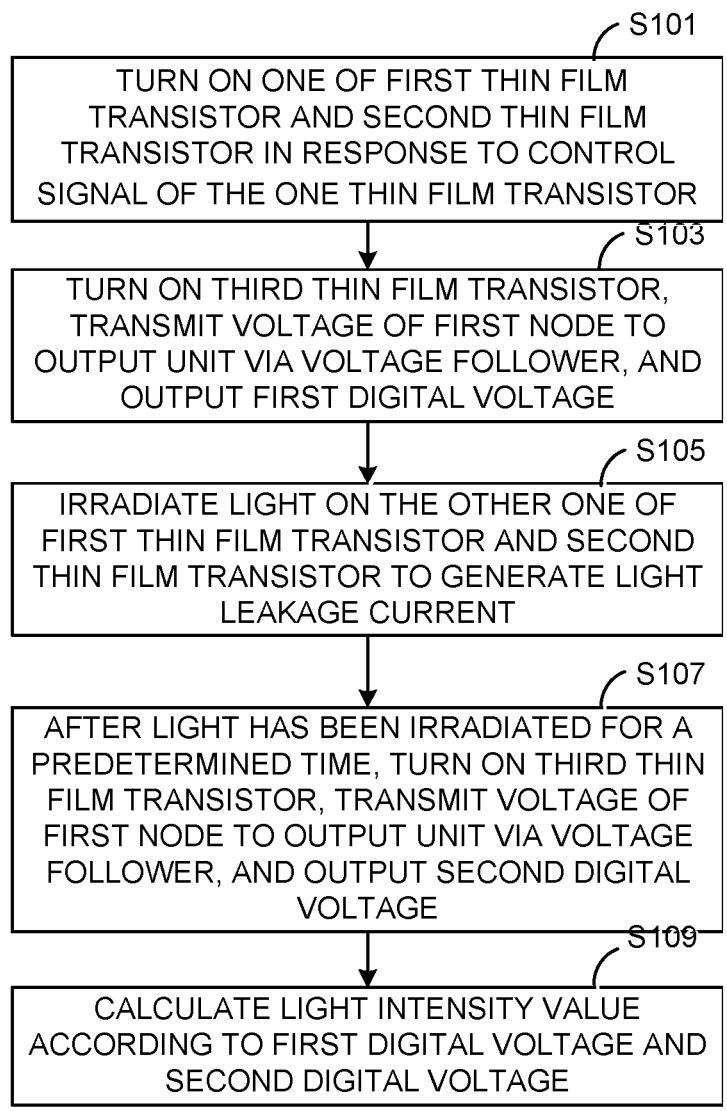
FIG. 7 shows a flowchart of a light detection method according to an embodiment of the present disclosure.

Another embodiment of the present disclosure also provides a light detection method using the above light sensor. As shown in FIG. 7, the light detection method includes steps of: S101: turning on the one of the first thin film transistor and the second thin film transistor in response to the control signal of the one thin film transistor; S103: turning on the third thin film transistor in response to the third control signal, wherein the voltage of the first node is transmitted to the input terminal of the output unit via the voltage follower, and the output unit outputs the first digital voltage, and then turning off the one thin film transistor, and turning off the third thin film transistor; S105: irradiating light on the other one of the first thin film transistor and the second thin film transistor to generate the light leakage current; S107: after light has been irradiated for a predetermined time, turning on the third thin film transistor in response to the third control signal, wherein the voltage of the first node is transmitted to the output unit via the voltage follower, and the output unit outputs the second digital voltage, and then turning off the third thin film transistor; and S109: calculating a light intensity value of the light irradiation according to the first digital voltage and the second digital voltage.

The light detection method according to the present embodiment obtains the reference voltage value by resetting one of the first and the second thin film transistors, then obtains the light-sensitive voltage value by irradiating light on the other one of the first and the second thin film transistors, and calculates the difference of the two voltages to obtain the variation of the thin film transistors in response to the light irradiation, in order to calculate the light intensity value.

Figure 8:
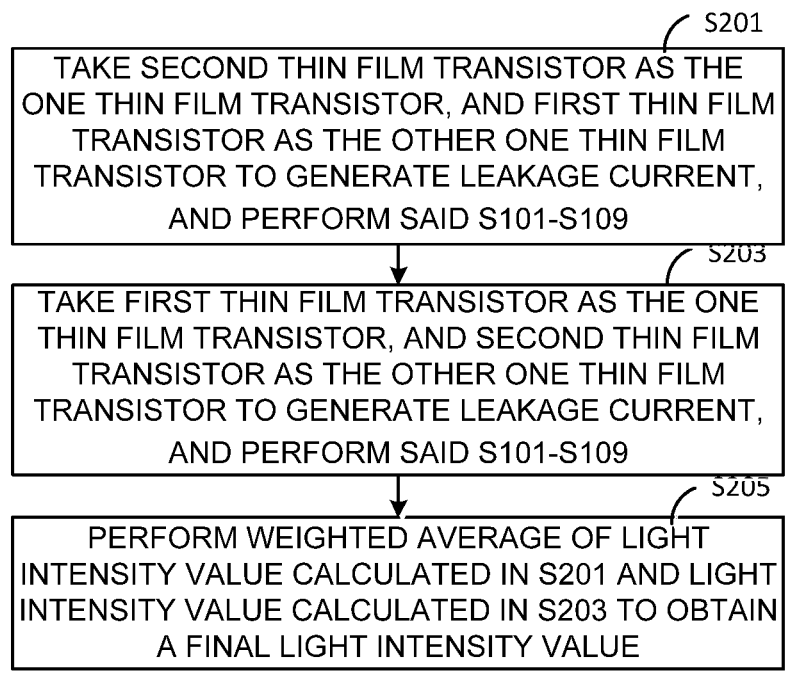
FIG. 8 shows a flowchart of a light detection method according to another embodiment of the present disclosure.

In another preferred embodiment, as shown in FIG. 8, the light detection method includes steps of: S201: taking the second thin film transistor as the one thin film transistor in step S101, and the first thin film transistor as the other thin film transistor in step S105, and performing steps S101-S109; S203: taking the first thin film transistor as the one thin film transistor in step S101, and the second thin film transistor as the other thin film transistor in step S105, and performing steps S101-S109; and S205: performing a weighted average of the light intensity value calculated in said S201 and the light intensity value calculated in step S203 to calculate a final light intensity value.

In the present embodiment, the second thin film transistor T2 is selected for reset and the first thin film transistor T1 is selected to receive light irradiation to obtain a light intensity value; and then the first thin film transistor T1 is selected for reset and the second thin film transistor T2 is selected to receive light irradiation to obtain another light intensity value. That is, bi-directional reset is performed on the light sensor to calculate the light intensity value.

Assuming that the off-state voltages of RST1 and RST2 are the same, the differences between the source and the drain of the first thin film transistor T1 and between the source and the drain of the second thin film transistor T2 are the same, and the lengths of duration of the two light irradiations are the same, the light leakage currents of the first thin film transistor T1 and the second thin film transistor T2 are the same. Hence, a weighted average of the light intensity values calculated in the two processes may obtain a light intensity value with higher accuracy, improving the measurement accuracy of the light intensity.

Another embodiment of the present disclosure further provides a display panel, including the above light sensor.

Another embodiment of the present disclosure further provides a display device, including the above display panel which may be any product or component that has a display function, such as a mobile phone, a tablet, a TV, a monitor, a notebook, a digital photo frame, a navigator, and the like.

It will be apparent to the skilled in the art that various modifications and variations may be made in the present disclosure without departing from the scope of the disclosure. Thus, if these modifications and variations of the present disclosure fall within the scope of the claims of the present disclosure and their equivalents, the present disclosure also intends to include these modifications and variations.

What is claimed is:

1. A light sensor, comprising:
   a first thin film transistor, having a first terminal connected to a first node, a second terminal receiving a first level signal, and a control terminal receiving a first control signal;
   a second thin film transistor, having a first terminal connected to the first node, a second terminal receiving a second level signal, and a control terminal receiving a second control signal;
   a voltage follower, having an input terminal connected to the first node, and an output terminal connected to a first terminal of a third thin film transistor;
   the third thin film transistor, having a first terminal connected to the output terminal of the voltage follower, a second terminal connected to an input terminal of an output unit, and a control terminal receiving a third control signal; and
   the output unit, having an input terminal connected to the second terminal of the third thin film transistor, and an output terminal connected to an output terminal of the light sensor,
   wherein when one of the first thin film transistor and the second thin film transistor is turned on in response to the control signal of the one thin film transistor, the third thin film transistor is turned on in response to the third control signal, a voltage of the first node is transmitted to the input terminal of the output unit via the voltage follower, and the output unit outputs a first digital voltage at its output terminal; and
   wherein when the one thin film transistor is turned off, the other one of the first thin film transistor and the second thin film transistor receives light irradiation to generate a light leakage current, the voltage of the first node is transmitted to the input terminal of the output unit via the voltage follower, and the output unit outputs a second digital voltage at its output terminal.

2. The light sensor according to claim 1, wherein active region material of the other one of the first thin film transistor and the second thin film transistor is amorphous silicon; and
   the one of the first thin film transistor and the second thin film transistor, the voltage follower and/or the third thin film transistor are back channel etch 'BCE' type thin film transistors or low temperature polysilicon thin film transistors.

3. The light sensor according to claim 2, wherein a light shielding module is arranged on the one of the first thin film transistor and the second thin film transistor, the voltage follower and/or the third thin film transistor for blocking light irradiation thereon.

4. The light sensor according to claim 1, wherein a light shielding module is arranged on the one of the first thin film transistor and the second thin film transistor, the voltage follower and/or the third thin film transistor for blocking light irradiation thereon.

5. The light sensor according to claim 4, wherein the light shielding module is a black matrix.

6. The light sensor according to claim 1, wherein the output unit comprises:
   a current source connected between the second terminal of the third thin film transistor and ground; and
   an A/D converter connected between the second terminal of the third thin film transistor and the output terminal of the output unit.

7. A light detection method using the light sensor according to claim 1, comprising steps of:
   S101: turning on the one of the first thin film transistor and the second thin film transistor in response to the control signal of the one thin film transistor;
   S103: turning on the third thin film transistor in response to the third control signal, wherein the voltage of the first node is transmitted to the input terminal of the output unit via the voltage follower, and the output unit outputs the first digital voltage, and then turning off the one thin film transistor, and turning off the third thin film transistor;
   S105: irradiating light on the other one of the first thin film transistor and the second thin film transistor to generate the light leakage current;
   S107: after light has been irradiated for a predetermined time, turning on the third thin film transistor in response to the third control signal, wherein the voltage of the first node is transmitted to the output unit via the voltage follower, and the output unit outputs the second digital voltage, and then turning off the third thin film transistor; and
   S109: calculating a light intensity value of the light irradiated according to the first digital voltage and the second digital voltage.

8. The light detection method according to claim 7, further comprising steps of:
   S201: taking the second thin film transistor as the one thin film transistor in step S101, and the first thin film transistor as the other thin film transistor in step S105, and performing steps S101-S109;
   S203: taking the first thin film transistor as the one thin film transistor in step S101, and the second thin film transistor as the other thin film transistor in step S105, and performing steps S101-S109; and
   S205: performing a weighted average of the light intensity value calculated in step S201 and the light intensity value calculated in step S203 to calculate a final light intensity value.

9. The light detection method according to claim 8, wherein active region material of the other one of the first thin film transistor and the second thin film transistor is amorphous silicon; and
   the one of the first thin film transistor and the second thin film transistor, the voltage follower and/or the third thin film transistor are back channel etch 'BCE' type thin film transistors or low temperature polysilicon thin film transistors.

10. The light detection method according to claim 8, wherein a light shielding module is arranged on the one of the first thin film transistor and the second thin film transistor, the voltage follower and/or the third thin film transistor for blocking light irradiation thereon.

11. The light detection method according to claim 8, wherein the light shielding module is a black matrix.

12. The light detection method according to claim 8, wherein the output unit comprises:
- a current source connected between the second terminal of the third thin film transistor and ground; and
- an A/D converter connected between the second terminal of the third thin film transistor and the output terminal of the output unit.

13. A display panel, comprising the light sensor according to claim 1.

14. The display panel according to claim 13, wherein active region material of the other one of the first thin film transistor and the second thin film transistor is amorphous silicon; and
- the one of the first thin film transistor and the second thin film transistor, the voltage follower and/or the third thin film transistor are back channel etch 'BCE' type thin film transistors or low temperature polysilicon thin film transistors.

15. The display panel according to claim 14, wherein a light shielding module is arranged on the one of the first thin film transistor and the second thin film transistor, the voltage follower and/or the third thin film transistor for blocking light irradiation thereon.

16. The display panel according to claim 13, wherein a light shielding module is arranged on the one of the first thin film transistor and the second thin film transistor, the voltage follower and/or the third thin film transistor for blocking light irradiation thereon.

17. The display panel according to claim 16, wherein the light shielding module is a black matrix.

18. The display panel according to claim 13, wherein the output unit comprises:
- a current source connected between the second terminal of the third thin film transistor and ground; and
- an A/D converter connected between the second terminal of the third thin film transistor and the output terminal of the output unit.

19. A display device, comprising the display panel according to claim 13.

* * * * *